United States Patent

Suzuya et al.

[11] Patent Number: 5,753,969
[45] Date of Patent: May 19, 1998

[54] RESIN SEALED SEMICONDUCTOR DEVICE INCLUDING A DIE PAD UNIFORMLY HAVING HEAT CONDUCTING PATHS AND CIRCULATING HOLES FOR FLUID RESIN

[75] Inventors: Nobuhito Suzuya; Morihiko Ikemizu; Terunari Takano, all of Yokohama; Kenji Uehara, Tokyo; Akito Yoshida, Yokohama, all of Japan

[73] Assignee: Kabushiki Kaisha Toshiba, Kawasaki, Japan

[21] Appl. No.: 696,662

[22] Filed: Aug. 14, 1996

[30] Foreign Application Priority Data

Aug. 15, 1995 [JP] Japan ................. 7-228629

[51] Int. Cl.⁶ .................. H01L 23/34; H01L 23/30; H01L 23/48
[52] U.S. Cl. ............ 257/667; 257/668; 257/687; 257/714
[58] Field of Search ................. 257/668, 667, 257/666, 687, 712, 709, 714, 786, 778

[56] References Cited

U.S. PATENT DOCUMENTS

| | | | |
|---|---|---|---|
| 3,905,038 | 9/1975 | Beyerlein | 257/672 |
| 4,390,598 | 6/1983 | Phy | 257/666 |
| 5,193,053 | 3/1993 | Sohobe | 257/668 |
| 5,225,710 | 7/1993 | Westerkamp | 257/675 |
| 5,231,755 | 8/1993 | Emanuel | 437/206 |
| 5,237,202 | 8/1993 | Shimizu et al. | 257/672 |
| 5,248,895 | 9/1993 | Nakazawa | 257/648 |
| 5,256,900 | 10/1993 | Hashizume et al. | 257/693 |
| 5,291,060 | 3/1994 | Shimizu et al. | 257/672 |
| 5,554,885 | 9/1996 | Yamasaki et al. | 257/668 |

FOREIGN PATENT DOCUMENTS 55-53450  4/1980  Japan ................. 257/669

*Primary Examiner*—Tom Thomas
*Assistant Examiner*—Alexander Oscar Williams
*Attorney, Agent, or Firm*—Finnegan, Henderson, Farabow, Garrett & Dunner, L.L.P.

[57] ABSTRACT

A semiconductor chip having a plurality of electrodes on its surface is fixed onto a die pad. The leads are spaced away from the die pad and connected to the electrodes of the semiconductor chip by means of a TAB tape. The die pad is substantially equal in size to the insulation film of the TAB tape. The die pad has a plurality of resin circulating holes around the semiconductor chip. The resin circulating holes are arranged such that a fluid resin sufficiently flows into a narrow area between the TAB tape and die pad. On the die pad, portions each between adjacent resin circulating holes serves as heat conducting paths. The heat generated from the semiconductor chip is transmitted to the entire region of the die pad through the heat conducting paths and then radiated outside.

9 Claims, 8 Drawing Sheets

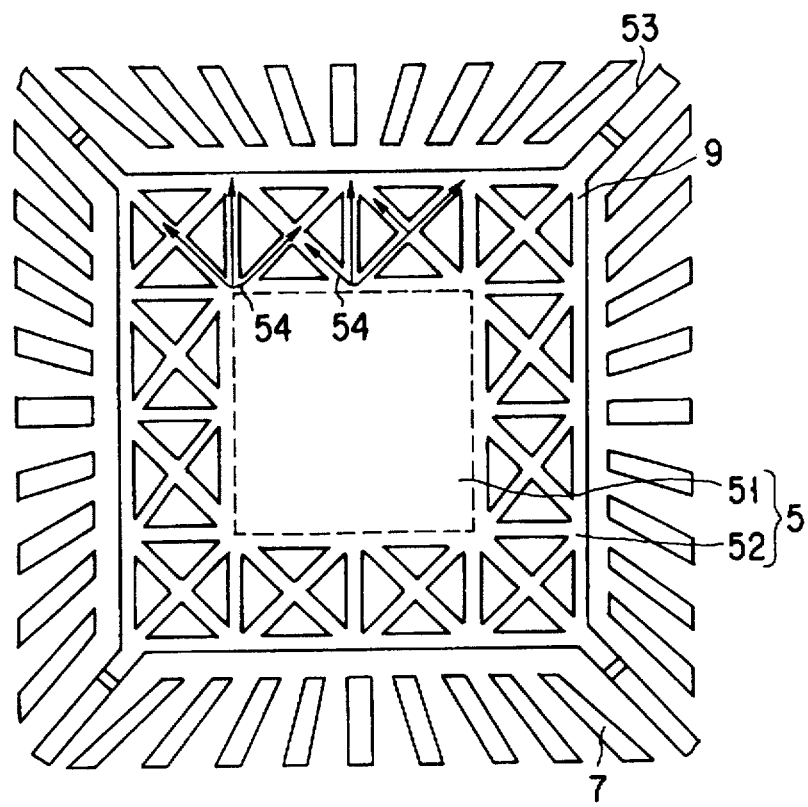
F I G. 6
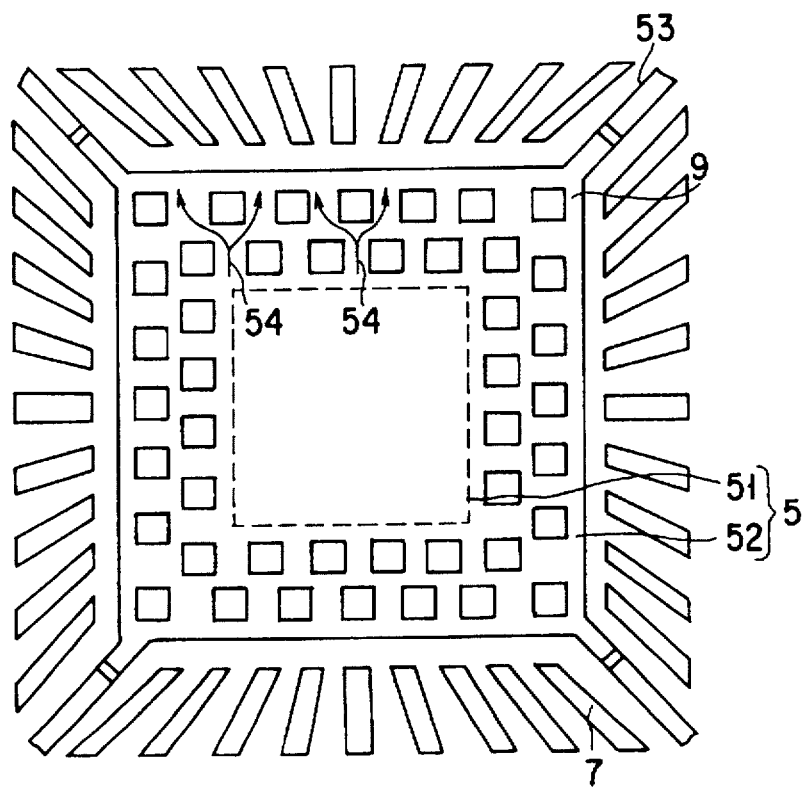
F I G. 7

5,753,969

RESIN SEALED SEMICONDUCTOR DEVICE INCLUDING A DIE PAD UNIFORMLY HAVING HEAT CONDUCTING PATHS AND CIRCULATING HOLES FOR FLUID RESIN

BACKGROUND OF THE INVENTION

1. Field of the Invention

The present invention relates to a resin sealed semiconductor device and, more specifically, to a lead frame which is used therefor and excellent in both resin fluidity and heat radiation.

2. Description of the Related Art

In a prior art semiconductor device having a number of pins or terminals, such as an IC and an LSI, wire bonding and wireless bonding are known as a means for electrically connecting a semiconductor element (chip) and external leads. According to the wire bonding, connecting electrodes such as bonding pads formed on a chip, and external leads are connected to each other by wires formed of aluminum, gold or the like. To bond the wires with the connecting electrodes or external leads, thermocompression bonding and ultrasonic bonding can be employed either alone or in combination. In the wireless bonding, all connecting electrodes formed on a chip are connected to external terminals at a time by specific bumps or metal leads. A tape carrier method, a flip chip method, a beam lead method, etc. are known as the latter bonding.

FIG. 1 is a cross-sectional view of a prior art semiconductor device constituted by wire bonding. The semiconductor device is protected by a resin sealing member 2 and specifically it is constituted by mounting a semiconductor element (chip) 1 on a lead frame 3, electrically connecting them by a bonding wire, and sealing them with resin. The lead frame 3 is made of metal such as an alloy of Fe and 42Ni and formed integrally with a die pad 5, inner leads 7 and outer leads 6 as one component.

The semiconductor chip 1 is adhered onto the die pad 5 by a conductive adhesive or the like. The size of the die pad is usually the same as that of the chip 1. The ends of the inner leads 7 are opposed to the chip 1. The chip 1 and inner leads 7 are connected to each other using bonding wires 4. Each of the bonding wires is connected to its corresponding connecting electrode (not shown) formed on the major surface of the chip 1. The chip 1, bonding wires 4, die pad 5 and inner leads 7 are sealed with the resin sealing member 2 such as epoxy resin.

In the recent semiconductor device, the amount of heat generating from a chip is increased in accordance with a high degree of integration and a high-speed operation. The heat-generating chip necessitates effectively radiating the heat. To do so, TAB (Tape Automated Bonding) can be adopted and, specifically, a tape carrier (TAB tape) can be used in place of bonding wires to electrically connect the chip and lead frame, thereby increasing the size of a die pad.

FIG. 2 is a cross-sectional view of a resin sealed semiconductor device using a TAB tape. This semiconductor device includes a chip 1, a lead frame 3 mounted with the chip 1, a TAB tape 8 for electrically connecting the chip 1 and lead frame 3. The lead frame 3 is constituted of an alloy of Fe and 42Ni or the like, and formed integrally with a die pad 5, inner leads 7 and outer leads 6, as one component. The TAB tape 8 includes a plurality of leads 83 each having lead end portions 81 and 82, and a lead supporting portion 84 formed of resin film for forming these leads 83 integrally as one component. The chip 1 is bonded to the die pad 5 by, e.g., a conductive adhesive 12. The lead end portion 81 is connected to a bump electrode 11 formed on the major surface of the chip 1, while the lead end portion 82 is connected to the end of each inner lead 7 of the lead frame 3. The chip 1, TAB tape 8, inner leads 7 of the lead frame 3, and die pad 5 of the lead frame 3 are resin-sealed by a resin sealing member 2 such as epoxy resin. The die pad 5 is formed in the resin sealing member 2 and extends to a point several millimeters away from the periphery of the member 2. The die pad 5 has substantially the same circumference as that of the resin film 84 of the lead supporting portion. Furthermore, the die pad 5 is located below the inner leads 7 by the thickness of the chip 1.

In the semiconductor device illustrated in FIG. 2, the chip 1 generates heat during its operation, and the heat is radiated therefrom through the die pad 5 connected to the chip 1. Since the die pad 5 extends to the proximity of the periphery of the resin sealing member 2, the heat can be transmitted toward the proximity of the periphery of the member 2 through the die pad 5. For this reason, even though the power consumption of chip 1 is increased due to a high degree of integration and a high-speed operation, the chip 1 can radiate heat satisfactorily; thus the normal operation of the semiconductor device can be maintained.

If, however, the size of the die pad is set larger than that of the chip in order to improve in heat radiation, the fluid resin is hindered from flowing at the time of sealing. As described above, since the die pad 5 is located below the inner leads 7 by the thickness of the chip 1, the space enclosed with the TAB tape 8 and die pad 5 and including the chip 1, is very narrow. The resin sealing member 2 is obtained by arranging the lead frame, chip, and tape carrier (TAB tape) in a resin mold, pouring the fluid resin into the resin mold by transfer mold, and hardening the fluid resin. The resin has to uniformly flowing into the mold in order to uniformly form the resin sealing member. In the constitution shown in FIG. 2, however, the die pad 5 is increased in size, so that, as indicated by arrow 21, the resin is hindered from sufficiently flowing between the die pad 5 and TAB tape 8. As a result, an interval between the die pad and tape carrier becomes smaller than expected, and a short circuit or a crack is likely to occur in the resin sealing member itself because of its nonuniformity.

SUMMARY OF THE INVENTION

It is accordingly an object of the present invention to provide a resin sealed semiconductor device including a uniform resin sealing member which is obtained, as designed, by causing a fluid resin to flow at the time of sealing, without deteriorating in heat radiation, a lead frame for achieving the resin sealed semiconductor device, and a method for manufacturing a resin sealed semiconductor device using the lead frame.

To attain the above object, according to a first aspect of the present invention, there is provided a resin sealed semiconductor device comprising:

a semiconductor element having a plurality of electrodes on a surface thereof;

an element mounting section including a first region on which the semiconductor element is mounted, and a second region formed around the first region and having a plurality of resin circulating holes, portions each between the plurality of resin circulating holes serving as heat conducting paths;

a plurality of leads spaced away from the element mounting section and electrically connected to the plurality of electrodes of the semiconductor element, the plurality of leads each including an inner lead and an outer lead;

a TAB tape formed of an insulation film and having leads for connecting the inner leads and the plurality of electrodes of the semiconductor element; and a resin sealing member for sealing the semiconductor element, the element mounting section, the TAB tape, and the inner leads, wherein the element mounting section is substantially equal in size to a circumference of the insulation film of the TAB tape, and heat generated from the semiconductor element is transmitted from the first region to all of the second region through the heat conducting paths, and radiated from the second region.

According to a second aspect of the present invention, there is provided a lead frame for use in a resin sealed semiconductor device, comprising:

an element mounting section including a first region on which a semiconductor element is mounted, and a second region formed around the first region and having a plurality of resin circulating holes, portions each between the plurality of resin circulating holes serving as heat conducting paths;

a lead section including a plurality of leads spaced away from the element mounting section; and a frame section for supporting the element mounting section and the lead section, wherein the plurality of resin circulating holes each have a size enough to circulate a fluid resin for sealing and are uniformly formed in the second region, and heat generated from the semiconductor element is transmitted from the first region to all of the second region through the heat conducting paths, and radiated from the second region.

According to a third aspect of the present invention, there is provided a method for manufacturing a resin sealed semiconductor device, comprising the steps of:

forming a lead frame including an element mounting section mounted with a semiconductor element and a lead section having supporting means of the element mounting section and a plurality of leads, the element mounting section being formed such that a difference in level between the element mounting section and the lead section is caused by depressing the supporting means and corresponds to a thickness of the semiconductor element, and the element mounting section being formed so as to have a plurality of resin circulating holes uniformly formed around the semiconductor element and heat conducting paths formed between the plurality of resin circulating holes;

electrically connecting each of electrodes of the semiconductor element with a corresponding one end portion of each lead of a tape carrier;

mounting the semiconductor element on the element mounting section, the semiconductor element being fixed onto the element mounting section by electrically connecting each of the plurality of leads of the lead section and another end portion of the each lead of the tape carrier which is formed by cutting a predetermined portion of the tape carrier; and resin-sealing the semiconductor element, the element mounting section, part of the lead section, and the tape carrier using a mold, a fluid resin being injected along one of the supporting means of the element mounting section and flowing through the plurality of circulating holes, thus filling the mold with the fluid resin.

According to the present invention having the above constitution, the size of a die pad of a lead frame is made larger than that of a chip, and a plurality of resin circulating holes and a plurality of heat conducting paths are formed in a region of the die pad where the chip is not formed. Therefore, a mold resin is prevented from being filled insufficiently or a TAB tape is prevented from being deformed, and the heat resistance can be lowered by satisfactory heat radiation in an operation mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a plan view of a second modification to the arrangement shown in FIG. 4;

FIG. 7 is a plan view of a third modification to the arrangement shown in FIG. 4;

DETAILED DESCRIPTION OF THE PREFERRED EMBODIMENTS

Figure 3:
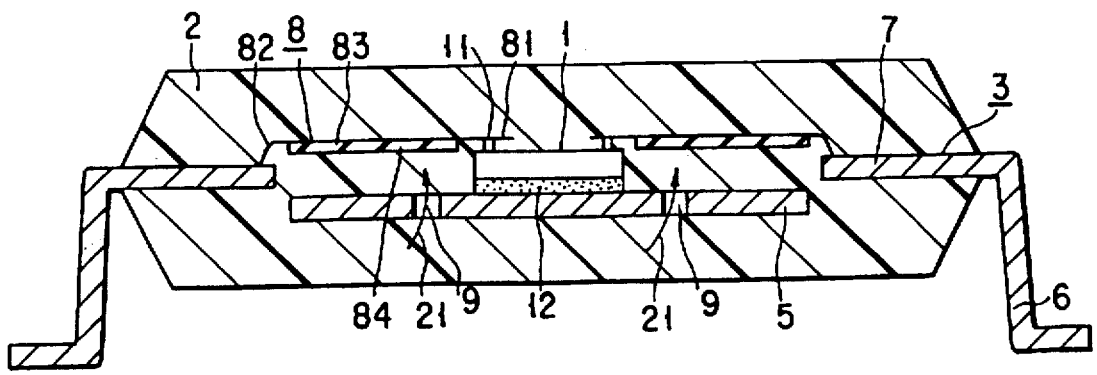
FIG. 3 is a cross-sectional view of a resin sealed semiconductor device according to a first embodiment of the present invention.
Figure 4:
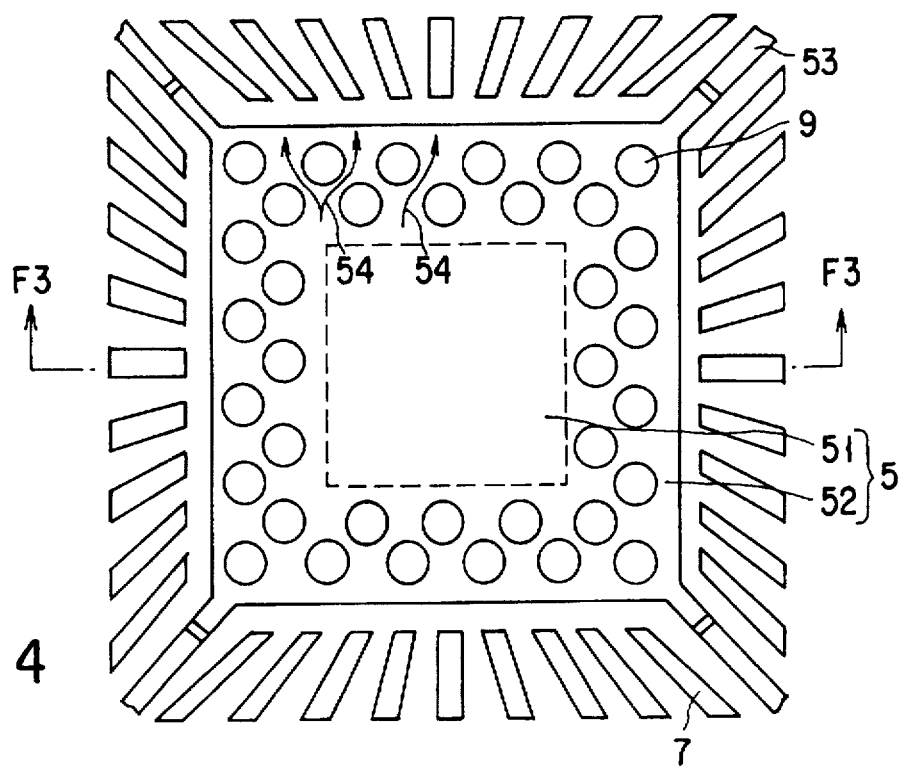
FIG. 4 is a plan view showing the arrangement of a die pad and its peripheral inner leads in the resin sealed semiconductor device of FIG. 3.

FIG. 3 is a cross-sectional view showing a resin sealed semiconductor device according to a first embodiment of the present invention, and FIG. 4 is a plan view showing a die pad and inner leads of a lead frame incorporated into the device of FIG. 3. For example, the resin sealed semiconductor device has leads of 240 pins, and the width of each lead ranges from 0.14 mm to 0.18 mm.

As shown in FIG. 8, the resin sealed semiconductor device includes a semiconductor chip 1 of silicon or the like, a lead frame 3 mounted with the chip 1, and a tape carrier (TAB tape) 8 for electrically connecting an internal circuit of the chip 1 and the lead frame 3. The lead frame 3 is constituted of metal such as an alloy of Fe and 42Ni, Cu, and an alloy containing Cu, and formed integrally with a die pad 5, inner leads 7 and outer leads 6, as one component. The TAB tape 8 includes a plurality of leads 83 each having lead end portions 81 and 82, and a lead supporting portion 84 formed of resin film for forming these leads 83 integrally as one component. The chip 1 is bonded to the die pad 5 by, e.g., a conductive adhesive 12. The lead end portion 81 is connected to a bump electrode 11 formed on the major surface of the chip 1, while the lead end portion 82 is connected to the end of each inner lead 7 of the lead frame 3. The chip 1, TAB tape 8, inner leads 7 of the lead frame 3, and die pad 5 of the lead frame 3 are resin-sealed by a resin sealing member 2 such as epoxy resin. The die pad 5 is formed in the resin sealing member 2 and extends to a point several millimeters away from the periphery of the member 2. The die pad 5 has substantially the same circumference as that of the resin film 84 of the lead supporting portion. The die pad 5 has tie bars 53 at its four corner sections and connected to a frame portion of the lead frame through the tie bars 53. When the lead frame 3 is arranged horizontally, the die pad 5 is located below the inner lead of the chip 1 by the thickness of the chip 1. Thus, the space enclosed with the TAB tape 8 and die pad 5 and including the chip 1, is very narrow.

The cross-sectional view of FIG. 3 is taken along line F3—F3 of the plan view of FIG. 4. The feature of the present invention lies in the die pad 5 surrounded by the inner leads 7 of the lead frame 3. The die pad 5 has a first region 51 in the central portion and a second region 52 in its peripheral portion. The chip 1 is bonded onto the first region 51, while a plurality of resin circulating holes 9 and a plurality of heat conducting paths 54 are formed in the second region 52. The resin circulating holes 9 are formed such that fluid resin is allowed to flow uniformly when the resin sealing member 2 is formed of the fluid resin. The resin circulating holes 9 are circular; however, the present invention is not limited to the circular holes but can be applied to one having an arbitrary shape such as an ellipse, a triangle, and a polygon.

Figure 5:
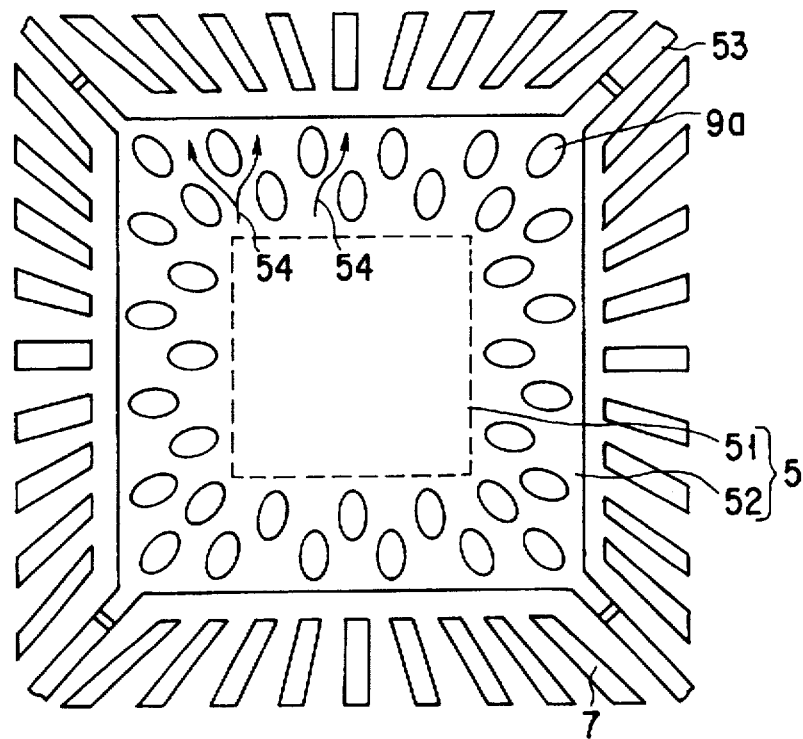
FIG. 5 is a plan view of a first modification to the arrangement shown in FIG. 4.

FIGS. 5, 6 and 7 illustrate examples of elliptic, triangular and rectangular resin circulating holes 9a, 9b and 9c, respectively. In all the examples, the holes 9a to 9c are formed so as to achieve the smooth flow of resin toward both faces of the second region 52, and heat conducting paths are formed like a mesh all over the second region 52, with the result that the heat generating from the chip during the operation is transmitted from the first region 51 to the entire second region 52, and easily radiated outside.

Of the resin circulating holes 9 shown in FIG. 4, at least one is arranged close to the corner of the die pad 5. The fluid resin thus sufficiently flows into the resin circulating holes 9, the corners of the die pad 5, and the sides thereof close to the corners. The holes 9 are staggered uniformly in the second region 52. The uniform arrangement of the holes 9 allows the fluid resin to uniformly flow into a portion between the TAB tape and die pad, and this portion is sufficiently filled with the fluid resin. In other words, the resin circulating holes 9 formed in the die pad 5, which is the feature of the present invention, enables the fluid resin to circulate sufficiently and smoothly.

The heat conducting paths 54 are formed between the holes 9 and extend continuously from the first region 51 to the sides of the second region 52. It is desirable to uniformly form the paths 54 all over the second region 52. The same is true of the examples shown in FIGS. 5 to 7.

In FIG. 4, the chip 1 generates heat and radiates it through the die pad 5. Since the die pad 5 extends to the proximity of the periphery of the resin sealing member 2, the heat is transmitted thereto through the semiconductor chip 1 and die pad 5 both having high heat conduction, and radiated outside the resin sealing member. For this reason, the chip can radiate heat satisfactorily even though its power consumption is increased because of a high degree of integration and a high-speed operation, thereby maintaining the normal operation of the semiconductor device.

Figure 8A:
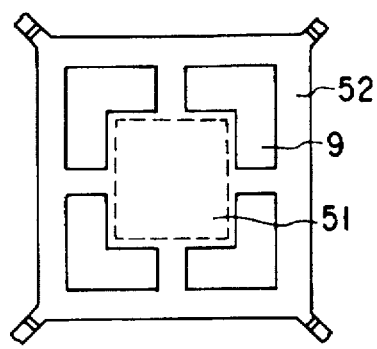
FIGS. 8A to 8D are plan views each showing an example of a die pad of a lead frame to compare them with that of the present invention as shown in FIG. 4.
Figure 8B:
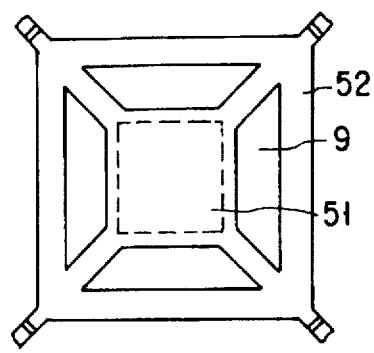
Figure 8C:
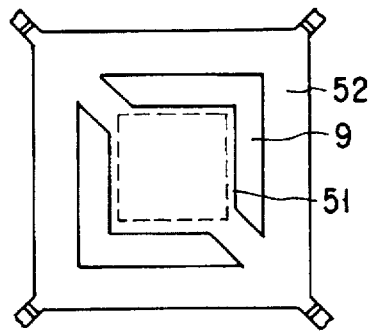
Figure 8D:
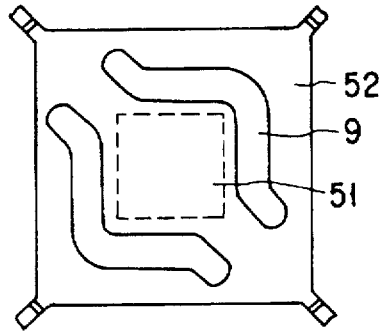
Figure 9:
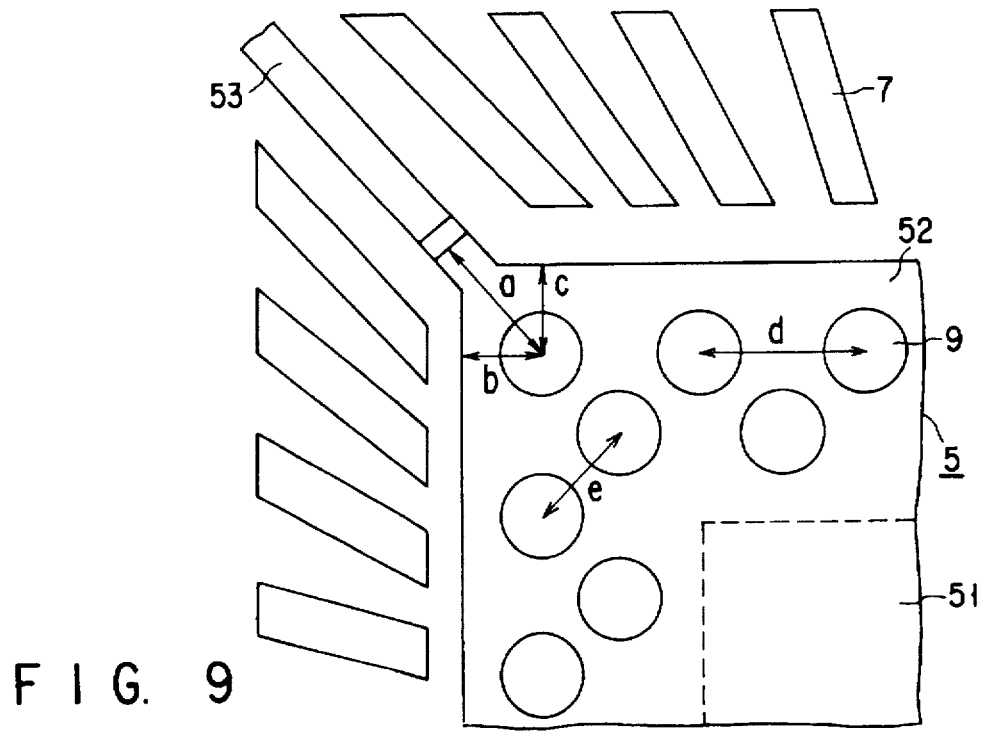
FIG. 9 is an enlarged plan view of a corner portion of the die pad shown in FIG. 4.

Referring to FIGS. 4, 8A to 8D, and 9, the resin circulating holes and heat conducting paths, formed on the die pad, will now be described. FIGS. 8A to 8D show examples of a die pad which are to be compared with that of the first embodiment shown in FIG. 4, and FIG. 9 is an enlarged plan view of a corner portion of the die pad shown in FIG. 4. The die pads shown in both FIG. 4 and FIGS. 8A to 8D are square and the length of one side is 18 mm. In FIG. 9, the resin circulating holes 9 are arranged in a staggered fashion, and a distance e between adjacent two holes is 2.55 mm, while a distance d between two holes interposing one hole is 3.6 mm. One of the resin circulating holes has to be formed as close as possible to each corner portion of the die pad 5 such that sufficient fluid resin flows into the corner portion. The distances a, b and c between the resin circulating hole closest to the corner section and the corner section, between the resin circulating hole and one of two sides of the die pad adjacent to the corner section, and between the resin circulating hole and the other side thereof, each should be set larger than the diameter of the resin circulating hole.

The size and shape of the resin circulating hole will be described with reference to FIGS. 8A to 8D.

TABLE 1

| Die Pad | Sample No. | Heat Resistance (°C./W) | |
|---|---|---|---|
| | | (Wind Velocity 0m/s) | (Wind Velocity 1m/s) |
| Type 1 | 1 | 26.1 | 23.6 |
| | 2 | 26.9 | 24.4 |
| Type 2 | 1 | 35.9 | 28.1 |
| | 2 | 35.1 | 27.7 |
| Type 3 | 1 | 35.0 | 29.4 |
| | 2 | 36.9 | 28.5 |
| Type 4 | 1 | 37.1 | 28.7 |
| | 2 | 38.0 | 30.8 |
| Type 5 | 1 | 35.5 | 26.9 |
| | 2 | 35.5 | 27.3 |

TABLE 1-continued

| | | Heat Resistance (°C/W) | |
|---|---|---|---|
| Die Pad | Sample No. | (Wind Velocity 0m/s) | (Wind Velocity 1m/s) |
| Type 6 | 1 | 31.7 | 24.4 |
| | 2 | 30.7 | 23.4 |

The above Table 1 shows heat resistances of die pads of types 1 to 6 of different shapes having different resin circulating holes in shape. All the die pads are constituted of copper (Cu). Each of the die pads of types 1 to 5 is 18 mm square, and the die pad of type 6 is 16.2 mm square. The die pads of types 1 and 6 are applied to the present invention, while the die pads of types 2 to 5 correspond to those shown in FIGS. 8A to 8D.

The sizes of the 1- to 5-type die pads are the same (324 mm$^2$), but the areas thereof excluding those of the resin circulating holes are different since the holes are different in size and shape. Specifically, the area of the 1-type die pad, as shown in FIG. 3 or FIG. 4, is 236.04 mm$^2$, that of the 2-type die pad, as shown in FIG. 8A, is 215.36 mm$^2$, that of the 3-type die pad, as shown in FIG. 8B, is 220.96 mm$^2$, that of the 4-type die pad, as shown in FIG. 8C, is 252.40 mm$^2$, and that of the 5-type die, as shown in FIG. 8D, is 246.87 mm$^2$. The resin circulating holes of 2- and 3-type die pads have a width of 2.8 mm, and those of 4- and 5-type die pads have a width of 2.0 mm. The holes of 1-type die pad have a diameter of 2.0 mm.

As is apparent from the above Table, since the heat resistance of the 1-type die pad is lower than that of each of the 2- to 5-type die pads, the arrangement of the 1-type die pad including a number of resin circulating holes formed in a staggered fashion is advantageous to a decrease in heat resistance. It can be thought that the difference in heat resistance is caused by the area of the die pad, excluding the resin circulating holes; however, the heat resistance of the 4- and 5-type die pads is higher than that of the 1-type die pad though the area of the former is larger than that of the latter. Thus, the difference in heat resistance does not depend on only the area of the die pad, but the shape thereof. The 2- and 3-type die pads each have four heat conducting paths and the 4- and 5-type die pads each have two heat conducting paths, whereas the 1-type die pad includes a number of heat conducting paths formed uniformly thereon. If the resin circulating holes are increased in size, the fluid resin becomes easy to flow freely, but the heat conducting paths are reduced in number and the heat resistance is increased. Moreover, it is likely that the resin will not be sufficiently flow into the corner sections of the die pad. Consequently, to increase the area of the die pad and form the heat conducting paths all over the die pad (to uniformly the small-sized heat circulating holes in a staggered fashion) reduces the heat resistance of the die pad.

Figure 10:
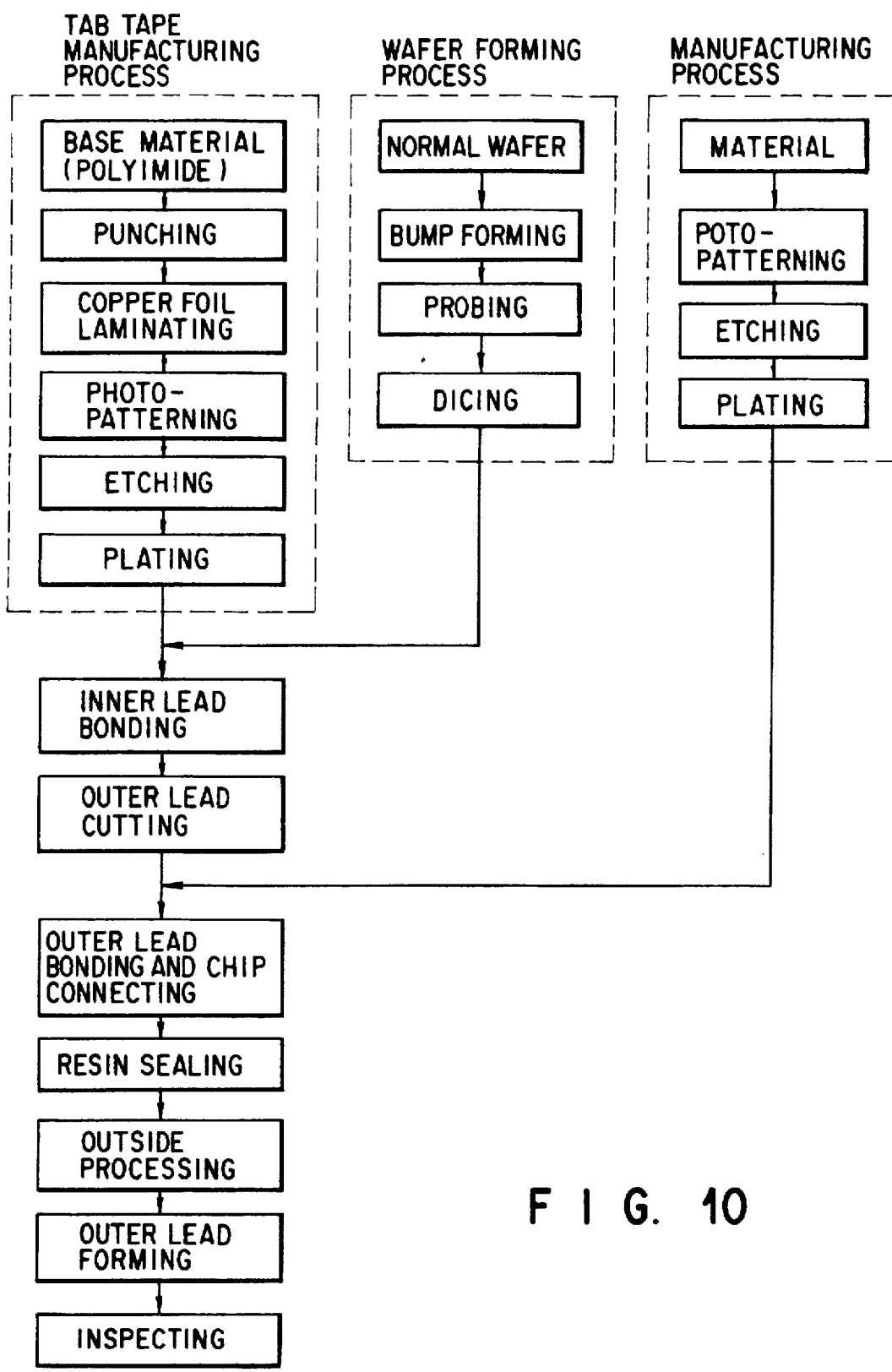
FIG. 10 is a flowchart showing a process of manufacturing a resin sealed semiconductor device according to the present invention.
Figure 11:
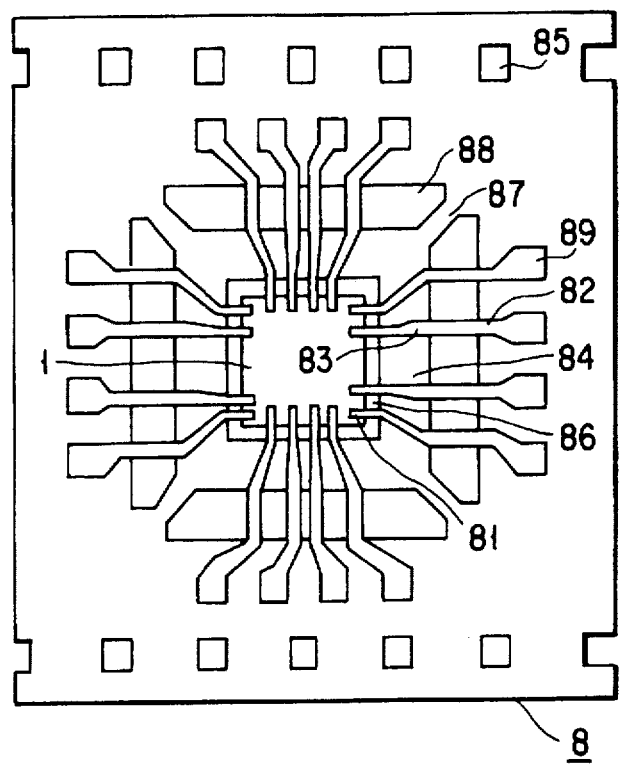
FIG. 11 is a plan view of a TAB tape mounted with a semiconductor chip in a method for manufacturing a resin sealed semiconductor device of the present invention.
Figure 13:
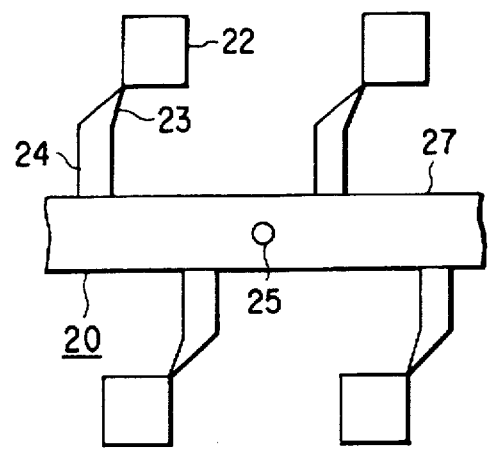
FIG. 13 is a schematic plan view showing part of the resin mold in the method for manufacturing a resin sealed semiconductor device of the present invention.
Figure 14:
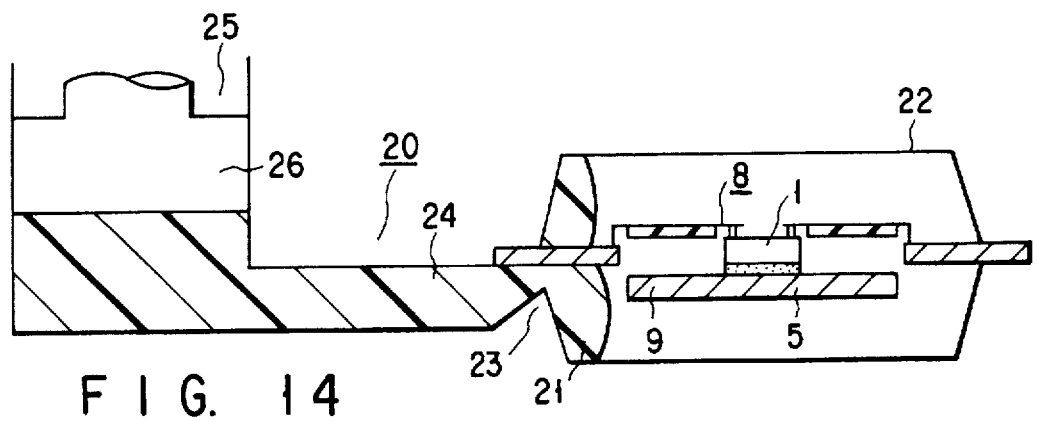
FIG. 14 is a cross-sectional view of the cavity to explain a process of filling the cavity with resin in the method for manufacturing a resin sealed semiconductor device of the present invention.

A method for manufacturing the foregoing resin sealed semiconductor device will now be described with reference to FIGS. 10 through FIG. 14. FIG. 10 is a flowchart showing a process of manufacturing the resin sealed semiconductor device, FIG. 11 is a plan view of a TAB tape mounted with a semiconductor chip, FIG. 12 is a plan view of a lead frame showing the positions of a cavity and a gate to clarify the arrangement of the lead frame in a resin mold for forming a resin sealing member, FIG. 13 is a schematic plan view showing part of the resin mold, and FIG. 14 is a cross-sectional view showing the cavity to explain a process of filling the cavity with resin.

As indicated by the flowchart of FIG. 10, a base material such as polyimide, which is constituted of an insulation film, is punched and copper foil is laminated to the surface of the base material. Photoresist on the base material is patterned by photopatterning, as is the copper foil by etching, thus forming wires such as leads and plating the wires to manufacture a TAB tape 8. As shown in FIG. 11, the TAB tape 8 is constituted of the base material of the insulation film and has feed holes 86 arranged at regular intervals on both sides thereof. A device hole 86 for mounting a chip 1 is formed in the central part of the insulation film, and a plurality of outer lead holes 88, which are adjacent to each other by bridging portions 87, are formed around the device hole 86. For example, a lead supporting portion 84 for holding the wires constituted of conductive material such as copper (Cu) is provided between the outer lead holes 88 and device holes 86. The lead supporting portion 84, which is formed of part of the insulation film, fixes each of the leads. Test pads 89 extend from the respective leads and are fixed on the insulation film.

A semiconductor wafer of silicon or the like on which an integrated circuit is formed, is prepared and a chip is obtained therefrom by bump forming, probing and dicing in sequence. Also, a metallic material constituted of an alloy of Fe and 42Ni, Cu, an alloy containing Cu or the like, is prepared and undergoes photopatterning, etching, plating and pressing in sequence, thereby manufacturing a lead frame 3 having resin circulating holes as shown in FIG. 12. During the manufacture, a depress operation for depressing a die pad 5 of the lead frame 3 hereby to form a difference between the die pad 5 and its other portion of the lead frame 3. This difference substantially the same as the thickness of the chip 1.

Figure 12:
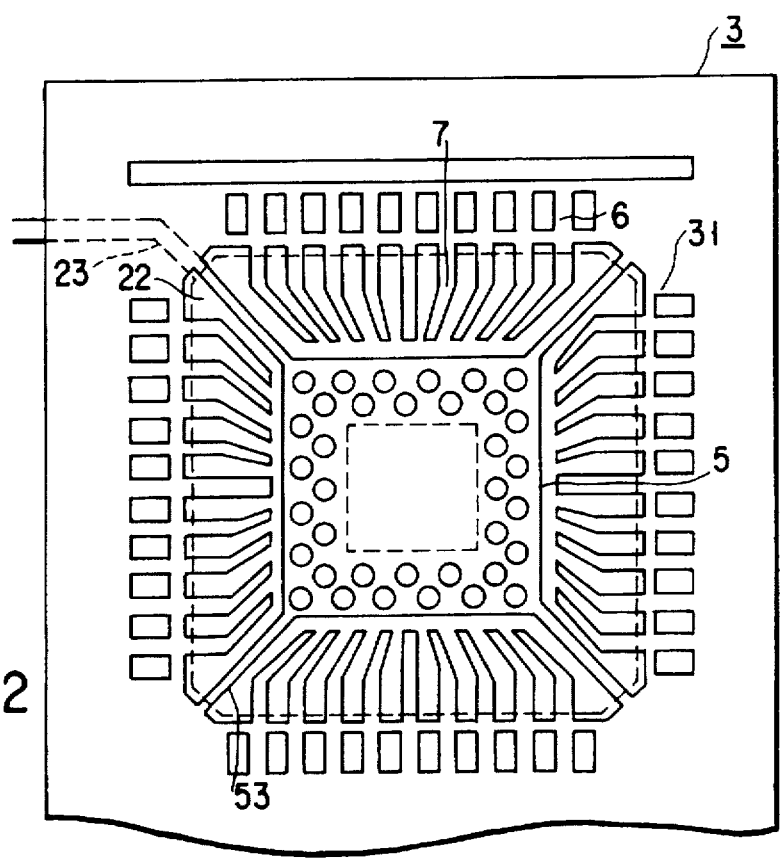
FIG. 12 is a plan view of a lead frame, showing the positions of a cavity and a gate to clarify the arrangement of the lead frame in a resin mold for forming a resin sealing member in the method for manufacturing a resin sealed semiconductor device of the present invention.

FIG. 12 illustrates a cavity 22 into which the fluid resin flows and a gate 23 for guiding the fluid resin to the cavity 22 as well as the lead frame 3 arranged in the resin mold 20. The lead frame 3 is formed of the die pad 5 supported by tie bars 53, outer leads 6, and inner leads 7 arranged around the tie pads. The tie bars 53 and outer leads 6 are supported by a frame 31.

The chip 1 and TAB tape 8 are connected to each other by bumps 11 formed on the chip 1 and, more specifically, the bumps 11 are connected to lead ends (inner leads) 81 of the TAB tape 8 (inner lead bonding). After that, the other lead ends (outer leads) 82 of the TAB tape 8 are formed and, in other words, the leads are cut in the outer lead holes 88, as are unnecessary portions of the tape (outer lead cutting). Then, the outer leads 82 of the TAB tape 8 and the inner leads 7 of the lead frame 3 are connected to each other and, at the same time, the chip 1 is connected to the die pad 5 by a conductive adhesive 12 or the like (outer lead bonding and chip connecting). After that, the chip 1, TAB tape 8 and its periphery are resin-sealed with a resin sealing member 2 such as epoxy resin.

The resin sealing member 2 is formed by a resin mold 20 (FIG. 13). FIG. 13 shows part of the resin mold 20 which is so constructed that the fluid resin is supplied from a pot 25 to a gate 23 through a cull 27 and a runner 24. The fluid resin flows from the gate 23 and is injected into the cavity 22. In this embodiment, the tie bars 53 are formed at the corner sections of the die pad 5 of the lead frame to support the die pad 5, and one of the tie bars 53 is disposed in the resin mold 20 such that a connecting portion between the one of the tie bars and the frame 31 coincides with that between the cavity 22 and gate 23. The resin sealing member 2 is formed by, e.g., transfer mold in the resin mold 20. The conditions for injecting the resin are that the resin is epoxy resin whose viscosity is 15±5 Pa·s and the injection time is about 10±1 seconds. In FIG. 14, a resin tablet supplied to the pot 25 is circulated as a fluid resin and caused to pass the cull (not shown) by the descent of a plunger 26. The fluid resin is supplied from the cull to the gate 23 via a runner 24 and then to the cavity 22. The cavity is thus filled with the resin. The fluid resin uniformly flows from a resin circulating hole 9 (having a diameter of about 2 mm) of the die pad 5 into between the TAB tape 8 and die pad 5, with the result that a uniform resin sealing member 2 is formed (see FIG. 3). After that, the outside processing and outer lead forming are executed in order to obtain the resin sealed semiconductor device as shown in FIG. 3. This semiconductor device is then inspected.

A second embodiment of the present invention will now be described with reference to FIGS. 15 and 16.

Figure 15:
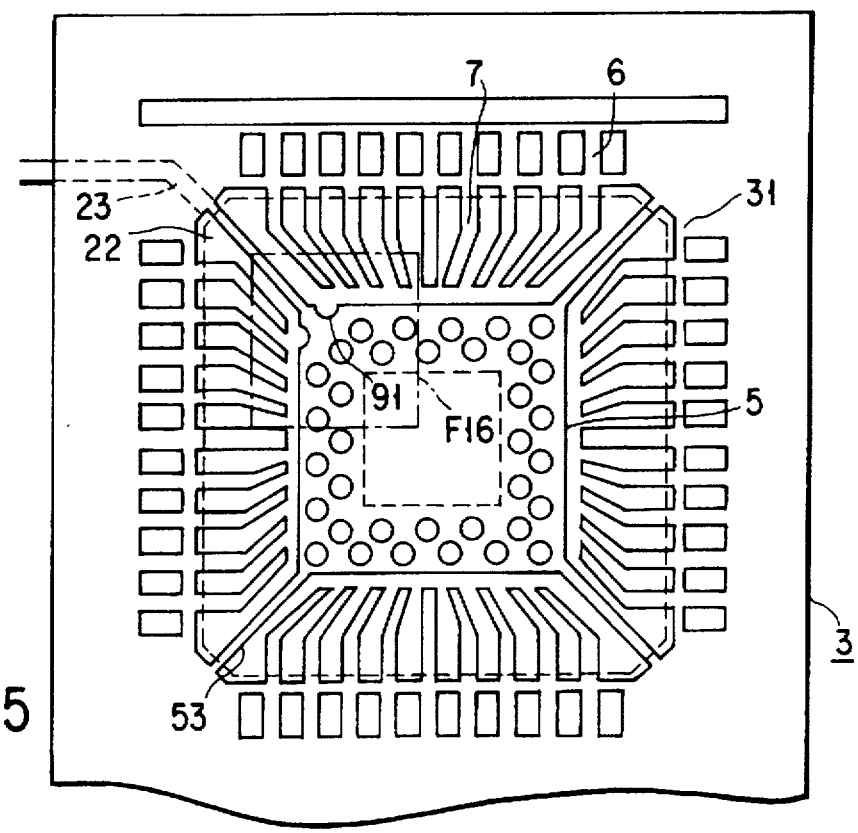
FIG. 15 is a plan view of a lead frame according to a second embodiment of the present invention, showing the positions of a cavity and a gate to clarify the arrangement of the lead frame in a resin mold.
Figure 16:
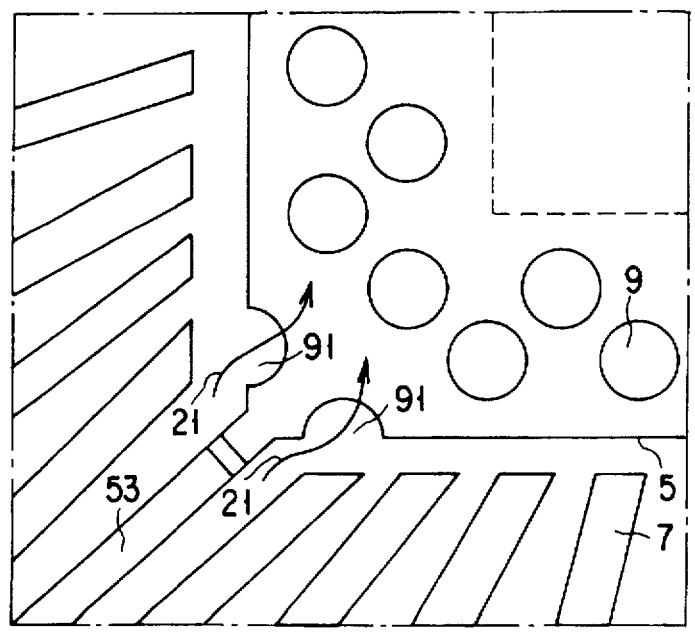
FIG. 16 is an enlarged plan view of part of the arrangement shown in FIG. 15.

FIG. 15 is a plan view of a lead frame showing the positions of a cavity and a gate to clarify the arrangement of the lead frame in a resin mold, and FIG. 16 is an enlarged plan view of area A shown in FIG. 15. In the second embodiment, as shown in FIG. 15, a lead frame 3 is arranged in the resin mold 20 (FIG. 14), and the fluid resin of the resin mold 20 is injected into a cavity 22 by means of a gate 23. The lead frame 3 is constituted of a die pad 5 supported by tie bars 53, and outer leads 6 and inner leads 7 arranged around the die pad 5. The tie bars 53 and outer leads 6 are supported by a frame 31. In this arrangement, the die pad 5 includes a chip mounting region (first region) and resin circulating holes 9 arranged in a staggered fashion, and its corner sections each have cutaway portions 91 on the sides adjacent thereto in place of the resin sealing hole 9.

The fluid resin flows from the gate 23 into a narrow space between the TAB tape and die pad through the resin circulating holes 9 and cutaway portions 91, thus forming a uniform resin sealing member. In particular, the cutaway portions 91 formed alongside the gate 23 smooth the flow of the fluid resin and improves the filling characteristic. Consequently, the cutaway portions 91 can be formed not only at the corner section of the die pad alongside the gate 23, as shown in FIG. 15, but also at all the corner sections thereof.

Figure 17:
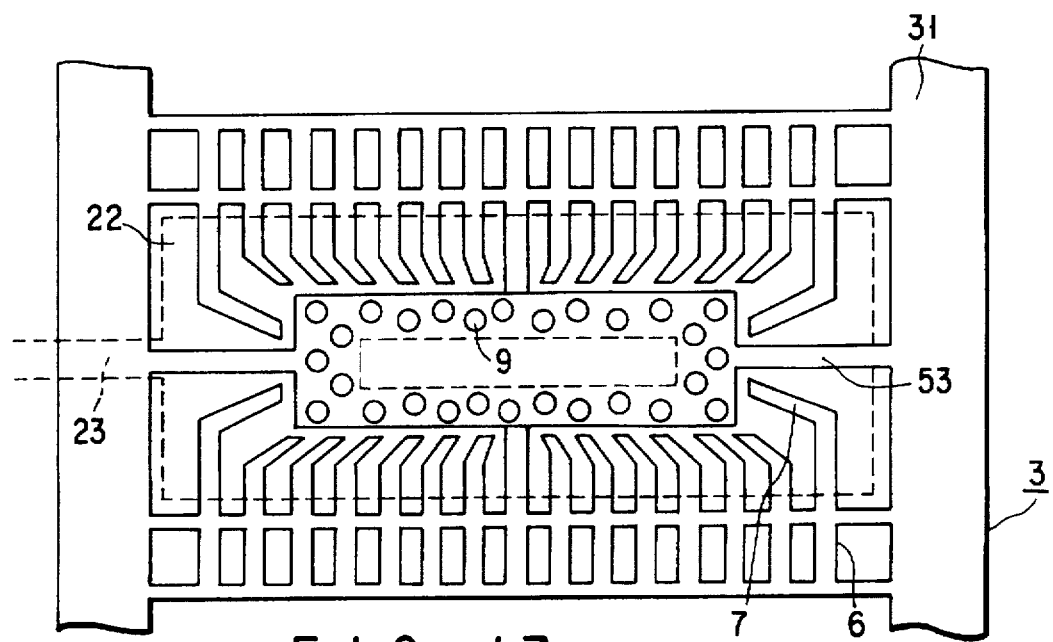
FIG. 17 is a plan view of a lead frame according to a third embodiment of the present invention.

FIG. 17 is a plan view of a lead frame according to a third embodiment, showing the positions of a cavity and a gate to clarify the arrangement of the lead frame in a resin mold.

In the third embodiment, too, a lead frame 3 is arranged in the resin mold 20 (FIG. 14), and the fluid resin of the resin mold 20 is injected into a cavity 22 by means of a gate 23. The lead frame 3 is constituted of a die pad 5 supported by tie bars 53, and outer leads 6 and inner leads 7 arranged around the die pad 5. The tie bars 53 and outer leads 6 are supported by a frame 31. In the third embodiment, the tie bars 53 are each formed in the middle of each side of the die pad 5, so that they are not connected to any corner sections of the die pad but in a free state. The die pad 5 includes a chip mounting region (first region) and resin circulating holes 9 arranged in a staggered fashion. The fluid resin flows from the gate 23 into a narrow space between the TAB tape and die pad through the resin circulating holes 9, thus forming a uniform resin sealing member. In replace of the resin circulating holes 9, cutaway portions can be formed on the sides adjacent to each of the corner sections of the die pad 5.

Figure 1:
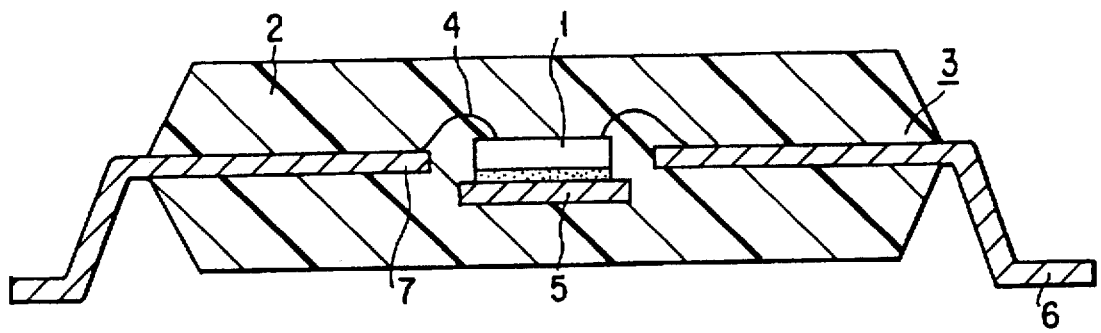
FIG. 1 is a cross-sectional view of a prior art resin sealed semiconductor device constituted by wire bonding.
Figure 2:
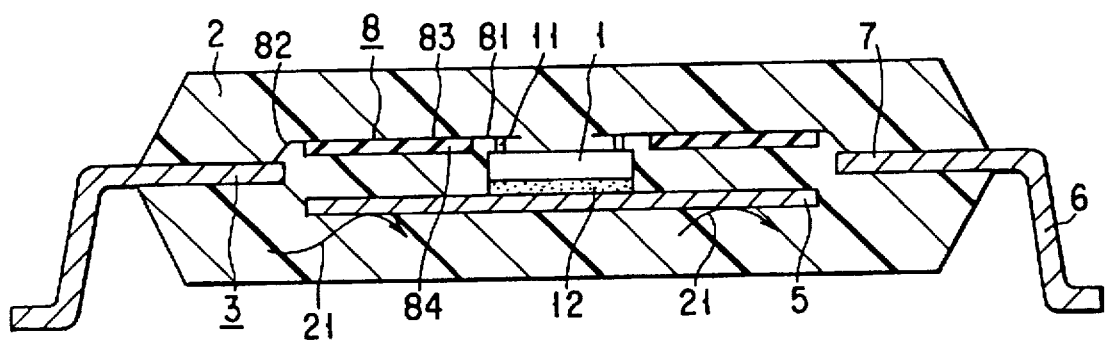
FIG. 2 is a cross-sectional view of a resin sealed semiconductor device using a TAB tape.

The heat resistance of the resin sealed semiconductor device according to the present invention will be explained. In the semiconductor device shown in FIG. 3, the lead frame is constituted of copper (Cu) and one side of the die pad is 18.0 mm. The heat resistance of the die pad is 26.1° C./W or 26.9° C./W, whereas that of a 16.2 mm square die pad is 31.7° C./W or 30.7° C./W. As a result of simulation, a resin sealed semiconductor device whose lead frame is formed of copper (Cu) and die pad is 14.0 mm square, has a heat resistance of 36.5° C./W, while the resin sealed semiconductor device, as shown in FIG. 2, whose lead frame is formed of an alloy of Fe and 42Ni and die pad is 8.5 mm square, has a heat resistance of 44.0° C./W.

In the present invention described above, if the diameter of each of the resin sealing holes formed in the die pad in a staggered fashion is set to 1.2 mm, it is somewhat hard to cause the fluid resin to flow uniformly under the foregoing resin injecting conditions; however in this case a uniform resin sealing member can be obtained if the viscosity of the fluid resin is controlled. The range between 1.0 mm and 3.0 mm is suitable for the diameter of the resin circulating hole, and about 2.0 mm is particularly suitable therefor.

In the prior art, a heat sink is employed or a heat spreader is stuck to a lead frame in order to improve in heat radiation; however, the step of mounting the heat sink or heat spreader is added and the cost of materials therefor is needed, thus making it difficult to manufacture a resin sealed semiconductor device. If the heat sink is used, a space corresponding to its thickness is required for a system in which a semiconductor is used, thus causing a problem in high packed density.

According to the present invention, the size of the die pad is larger than that of the chip to increase the area of the lead frame from which heat is radiated, and to lower the heat resistance, and the plurality of resin circulating holes and heat conducting paths are uniformly formed on the die pad. Consequently, unlike in the prior art, neither the heat sink nor the heat spreader is required, and neither the manufacturing steps nor costs are increased. Furthermore, the heat resistance can be lowered without changing the size of a package, and a resin sealing member can be formed uniformly with high reliability by preventing the mold resin from being filled insufficiently or by preventing the TAB tape from being deformed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resin sealed semiconductor device comprising:
   a semiconductor element having a plurality of electrodes on a surface thereof;
   a die pad including a first region on which said semiconductor element is mounted, and a second region formed around said first region and having a plurality of resin circulating holes of substantially the same shape and being uniformly spaced around the semiconductor element;
   a TAB (Tape Automated Bonding) tape, formed of an insulation film and located opposite to the resin circulating holes of said second region, the TAB tape having leads connected to the plurality of electrodes of said semiconductor element; and
   a resin sealing member for sealing said semiconductor element, said die pad, said TAB tape, and said leads.

2. The device of claim 1, wherein said plurality of resin circulating holes each have a circular shape.

3. The device of claim 2, wherein the plurality of resin circulating holes of said die pad each has a diameter ranging from 1.0 mm to 2.0 mm, and portions of said second region located between each of said plurality of resin circulating holes serve as heat conducting paths for heat emitted from the semiconductor element.

4. The device of claim 1, wherein said die pad has a rectangular shape and one of said plurality of resin circulating holes is located in each corner section of the die pad.

5. The device of claim 2, wherein said die pad has a rectangular shape and further includes:

cutaway portions, formed in two corner sections of said die pad, for circulating the fluid resin.

6. The device of claim 4, wherein each corner section is located at a position where fluid resin is injected.

7. The device of claim 2, further including:

a lead frame having a plurality of inner leads and supporting means located between said inner leads, and wherein said die pad is bonded to said supporting means such that said die pad is located on a level different from a level of said inner leads.

8. The device of 7, wherein a difference between the level of said die pad and the level of said inner leads corresponds to a thickness of the semiconductor element.

9. The device of claim 2, wherein said plurality of resin circulating holes are arranged in a staggered fashion around the semiconductor element and a distance between two resin circulating holes ranges from 2.55 mm to 3.6 mm.

* * * * *

UNITED STATES PATENT AND TRADEMARK OFFICE
CERTIFICATE OF CORRECTION

PATENT NO. : 5,753,969
DATED : May 19, 1998
INVENTOR(S) : Nobuhito SUZUYA et al.

It is certified that error appears in the above-indentified patent and that said Letters Patent is hereby corrected as shown below:

Claim 8, Col. 12, line 7, before "7", insert --claim--.

Signed and Sealed this

Sixth Day of July, 1999

Attest:

Q. TODD DICKINSON

*Attesting Officer*     Acting Commissioner of Patents and Trademarks